(12) United States Patent
Grolier et al.

(10) Patent No.: US 8,193,070 B2
(45) Date of Patent: Jun. 5, 2012

(54) METHOD FOR BONDING LAYERS, CORRESPONDING DEVICE AND ORGANIC LIGHT-EMITTING DIODE

(75) Inventors: Vincent Grolier, Regensburg (DE); Andreas Plössl, Regensburg (DE); Marianne Renner, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 640 days.

(21) Appl. No.: 11/992,992

(22) PCT Filed: Sep. 22, 2006

(86) PCT No.: PCT/DE2006/001688
§ 371 (c)(1),
(2), (4) Date: May 5, 2009

(87) PCT Pub. No.: WO2007/036208
PCT Pub. Date: Apr. 5, 2007

(65) Prior Publication Data
US 2009/0218591 A1    Sep. 3, 2009

(30) Foreign Application Priority Data
Sep. 30, 2005 (DE) .......................... 10 2005 046 942

(51) Int. Cl.
  *H01L 21/30* (2006.01)
  *H01L 29/06* (2006.01)
(52) U.S. Cl. ........................................ 438/455; 257/625
(58) Field of Classification Search .................. 438/107, 438/406, 455; 349/74, 106; 257/625, 676, 257/E23.023, E23.077
See application file for complete search history.

(56) References Cited

U.S. PATENT DOCUMENTS

| | | | |
|---|---|---|---|
| 4,371,231 A | 2/1983 | Jung | |
| 4,607,779 A | 8/1986 | Burns | |
| 5,996,221 A | 12/1999 | Chirovsky et al. | |
| 6,878,563 B2 | 4/2005 | Bader et al. | |
| 6,888,166 B2 * | 5/2005 | Kon et al. | 257/79 |
| 2003/0043316 A1 | 3/2003 | Matsumoto et al. | |
| 2003/0214618 A1 | 11/2003 | Tao et al. | |
| 2004/0191939 A1 | 9/2004 | Kon et al. | |
| 2005/0104081 A1* | 5/2005 | Kim et al. | 257/99 |

FOREIGN PATENT DOCUMENTS

| | | |
|---|---|---|
| EP | 0 905 797 | 8/1998 |
| EP | 1 603 171 | 5/2005 |
| JP | 2004 178985 | 6/2004 |
| JP | 2005-123530 | 5/2005 |
| WO | WO 02/13281 | 2/2002 |
| WO | WO 2005/064697 | 7/2005 |

OTHER PUBLICATIONS

C.H. Tsau et al., "Fabrication of wafer-level thermocompression bonds" Journal of Microelectromechanical Systems, vol. 11, No. 6, pp. 641-647, Dec. 1, 2002. M.M.V. Taklo et al., "Strong, high-yield and low temperature thermocompression silicon wafer-level bonding with gold", Journal of Micromechanical Engineering, vol. 14, pp. 884-890, Apr. 13, 2004.

* cited by examiner

*Primary Examiner* — Calvin Lee
(74) *Attorney, Agent, or Firm* — Cozen O'Connor

(57) ABSTRACT

A method for bonding several layers, which comprise at least one thermally bondable material, by means of a joint layer produced with the aid of thermocompression at least one of the layers comprising a semiconductor material, as well as to a correspondingly manufactured device. Also disclosed is a method for manufacturing an organic light-emitting diode and an organic light-emitting diode that is encapsulated between two cover layers with the aid of thermocompression.

17 Claims, 5 Drawing Sheets

METHOD FOR BONDING LAYERS, CORRESPONDING DEVICE AND ORGANIC LIGHT-EMITTING DIODE

RELATED APPLICATIONS

This is a U.S. national stage of application No. PCT/DE2006/001688, filed on 22 Sep. 2006.

This patent application claims the priority of German patent application nos. 10 2005 046 942.6 filed Sep. 30, 2005, the disclosure content of which is hereby incorporated by reference.

FIELD OF THE INVENTION

The invention pertains to a method for bonding layers, particularly in the manufacture of radiation-emitting semiconductor devices and organic light-emitting diodes, to a radiation-emitting device, particularly a radiation-emitting semiconductor device, manufactured by means of this method, and to an organic light-emitting diode.

BACKGROUND OF THE INVENTION

The utilization of suitable joining techniques is of decisive importance in the manufacture of radiation-emitting devices, particularly semiconductor devices in thin-film technology, and organic light-emitting diodes or so-called OLEDs.

The utilization of thin-film technology in radiation-emitting semiconductor devices is suitable, among other things, for the manufacture of light-emitting diodes with IR-, UV- or visible spectrum and of laser diodes (vertical cavity surface-emitting lasers or vertical external cavity surface-emitting lasers).

Thin-film light-emitting diode chips are described, for example, in U.S. Pat. No. 6,878,563 B2, WO 02/13281 A1 and EP 0905797 A2.

In the manufacture of radiation-emitting semiconductor devices in thin-film technology, a desired semiconductor structure is initially applied onto an epitaxial substrate. Subsequently, the epitaxial layer needs to be transferred to a carrier body (equivalent substrate). During this transfer, the epitaxial semiconductor heterostructure is bonded to the equivalent substrate with the aid of a joining technique. The growth substrate is then removed.

In addition to the mechanical stability of the joining technique, other parameters are also of decisive importance. The optoelectronic layer usually needs to be coupled to the equivalent substrate in an electrically or thermally conductive fashion. This is why metallic bonds are particularly suitable in this respect.

Until now, semiconductor heterostructures were usually bonded to the equivalent substrate by soldering (eutectic bonding) or adhesive bonding. A metallic bond produced by soldering is preferred because such a bond is more suitable due to its electrical and thermal conductivity. However, molten metals as they are produced, e.g., in soldering processes, can attack adjacent functional metal layers such as reflective layers or electrical contacts. Consequently, suitable blocking layers need to reliably separate the joining zone from functional layers or functional zones, respectively. However, the utilization of such blocking layers can create problems. Blocking layers can lead to dewetting of the solder and therefore reduce the adhesion. This is why the utilization of the soldering technique usually requires complex layer and material combinations.

The utilization of joining techniques in the manufacture of organic light-emitting diodes, in contrast, concerns the required encapsulation of these devices. Organic light-emitting diodes usually feature materials that need to be protected from environmental influences by means of an encapsulation. For this purpose, a layer is frequently bonded to another cover-like layer by means of a joining technique such that the actual organic light-emitting diode structure is hermetically encapsulated between the layers.

Adhesive bonding techniques as they are frequently utilized in the manufacture of organic light-emitting diodes are characterized by simple processing steps. However, they do not always provide the desired durability or impermeability, respectively.

SUMMARY OF THE INVENTION

One object of the present invention is to provide a simple and cost-efficient option for improving the bond between layers, as well as correspondingly manufactured devices.

A method for bonding a plurality of layer sequences, which comprise at least one thermally bondable material, at least one of the layer sequences comprising a semiconductor material, wherein the method comprises applying thermocompression to the plurality of layer sequences for producing a joint layer.

Disclosed herein is a joining technique or bonding technique for producing, in particular, a metallic bond. The metallic bond can be produced without molten metals due to the utilization of a thermocompression process. It is particularly advantageous that a transient liquid phase of the metal layers to be bonded does not occur. This results in a simplified layer structure, a cost-efficient manufacturing method, and a precisely defined joining or bonding area.

With respect to organic light-emitting diodes, the disclosed method makes it possible to achieve a durable hermetic encapsulation of the devices. In addition, a non-vaporizable getter material provided within the encapsulation can be activated.

In the manufacture of radiation-emitting thin-film semiconductor devices, the disclosed method is used for bonding a semiconductor material to an equivalent substrate by means of at least one gold layer, namely with the aid of thermocompression (thermocompression bonding). Since the semiconductor material should be electrically or thermally coupled to the equivalent substrate by means of the gold layer, at least one of the two components to be bonded features an electrical pad that faces the joining zone. The surface of the semiconductor material and of the equivalent substrate which faces the joining zone may also feature other functional layers such as, e.g., reflective layers, barrier layers, blocking layers and/or adhesion-promoting layers.

A gold layer is arranged on the substrate or the layers situated thereon and on the semiconductor material and the layers arranged thereon, namely in the direction of the joining or bonding area. These two gold layers are brought into contact with one another and joined into a common joint layer by means of thermocompression with predefined parameters. The common joint layer of gold advantageously has a total thickness between 100 nm and 5 μm. Preferred embodiments of the invention have total thicknesses between 500 nm and 2.5 μm for processed wafers. In principle, the two individual gold layers may also have an asymmetric thickness distribution before the joining process. In other words, gold layers of different thickness can be joined into a common joint layer.

The minimum or maximum layer thickness is defined in that a common plane joint layer can be produced. The maximum layer thickness is additionally defined by technical-economical considerations because excessively thick layers are not required, but very expensive.

When bonding very smooth surfaces such as, for example, unprocessed silicon wafers, a gold layer that has a thickness of less than 10 nm and is applied to one side may already suffice for achieving a metallic bond with another gold layer on the other component to be bonded.

The joining step is preferably carried out in a temperature range above 200° C. The typical upper temperature limit lies, for example, at 500° C., but may also be higher. Practical temperature ranges result, among other things, from the compositions of the layer sequences of the individual components to be bonded. With respect to radiation-emitting thin-film chips that are based on gallium indium nitride (GaInN), a practical temperature range lies between approximately 350° C. and 400° C. With respect to radiation-emitting thin-film chips that are based on aluminum gallium indium phosphite (AlGaInP), the preferred temperature range lies between 350° C. and 500° C.

These temperatures should act upon the components to be bonded for between 10 sec and 10 min. Shorter times usually make it impossible to produce a sufficient bond, and longer times may lead to damage to the semiconductor heterostructure, as well as to other functional layers. Excessively long reaction times also result in extended cycle times, and therefore lower productivity during manufacture.

During the thermocompression, the pressure exerted to press together the two components to be bonded should lie between $1\times10^5$ Pascal and $2\times10^7$ Pascal. With respect to processed wafers with a diameter of 100 mm and a structure-related pad area of 50%, it is advantageous to exert a force between approximately 1000 and 100,000 N.

According to another advantageous embodiment of the invention, at least one functional layer is respectively arranged between the gold layer and the semiconductor material and between the gold layer and the equivalent substrate, wherein said functional layers consist of adhesion-promoting layers, reflective layers, blocking layers or barrier layers, contact layers and/or buffer layers.

In this case, adhesion-promoting layers may serve for solidly and evenly bonding the gold layer applied prior to the joining process to the equivalent substrate and the semiconductor material or to other functional layers.

In the manufacture of radiation-emitting semiconductor devices, reflective layers can increase the light output at the light coupling-out surface situated opposite to the reflective surface.

Blocking layers may serve, in particular, for preventing or reducing an ion transport via the layers during the thermocompression process.

Contact layers may serve for improving the electrical or thermal contact of the various layer sequences; buffer layers are suitable for adapting different lattice structures (different lattice constants) of individual layers of the layer sequences to one another.

According to another advantageous embodiment of the invention, the thermocompression process is not only used for bonding two gold layers into a common joining zone, but also for a multilayer structure that respectively consists of a gold layer and an aluminum layer with a blocking layer arranged in-between that is used instead of a simple gold layer. This makes it possible to simultaneously utilize the ductility of the aluminum and the inert properties of the gold layer. The ability to deform the aluminum assists in producing an integral bond between the surfaces while the inert properties of gold eliminate the need for ultrasonic welding processes or frictional movements when bonding large surfaces. Furthermore, the utilization of aluminum layers additionally makes it possible to reduce the costs. The blocking layer, e.g., of tungsten (W) or titanium tungsten (TiW) prevents the formation of undesirable intermetallic phases of gold and aluminum that frequently lead to reliability risks referred to as "purple plague."

According to another advantageous embodiment of the invention, the thermocompression process does not contain any steps such as frictional movements or ultrasonic welding processes. In this advantageous embodiment of the invention, the semiconductor layers and the equivalent substrate are subjected to low mechanical stresses. This makes it possible to better protect the semiconductor layer sequence from being destroyed. Consequently, the joining technique is largely limited to the exertion of pressure and the effect of elevated temperatures.

A device manufactured in accordance with the described method therefore can have a simpler layer structure and consequently also be manufactured more cost-effectively. In addition, devices of this type usually have a lower electrical resistance and a higher thermal conductivity in the joining area. Since the inventive devices are not subjected to any molten metals as they are created, e.g., on devices in which the substrate transfer is realized by means of soldering, adjacent metal layers such as possible reflective layers or electrical contacts are protected from damage.

The inventive method also makes it possible to process entire wafers. With respect to the joining zone, the resulting semifinished products provide advantages similar to those described above with reference to devices manufactured in accordance with the invention.

The scope of the invention also includes the encapsulation of organic light-emitting diodes (OLEDs). A multilayer structure—the so-called OLED structure—is typically situated in the interior of these organic light-emitting diodes. Layers of radiation-emitting polymers or radiation-emitting small molecules, as well as layers of electron hole-conducting polymers or electron hole-conducting small molecules, are in this case usually arranged between two contact layers of the anode and the cathode. These layer sequences need to be hermetically encapsulated, in particular in order to be protected from environmental influences.

Organic polymers, in particular, as well as the contact layers of OLEDs are susceptible to the effects of atmospheric gases and moisture. On the other hand, the contact layers of the OLEDs may contain alkaline earth metals that should be hermetically encapsulated due to their high reactivity. For this purpose, they are usually encapsulated between transparent cover layers. Popular materials for such cover layers are glass or various polymer materials or plastics. These cover layers are advantageously transparent with respect to the emission wavelength of the radiation-emitting polymers or small molecules.

In an embodiment of the invention, the cover layers are bonded to one another with the aid of thermocompression (thermocompression bonding) such that the entire layer sequence of the organic light-emitting diode is encapsulated.

Another advantageous embodiment of the encapsulation of organic light-emitting diodes is characterized in that at least one of the two layers enclosing the organic light-emitting diode structure is transparent with respect to the emission wavelengths of the radiation-emitting small molecules or the radiation-emitting polymers.

According to one preferred embodiment of the invention, another material or a bonding layer sequence of materials that are bonded to one another with the aid of thermocompression is applied to opposing sections of the two cover layers. These materials may contain, in particular, gold or other inert metals. In other embodiments, however, it is also possible to utilize bonding layer sequences that consist of several layers with different materials and functions.

With respect to the encapsulation of organic light-emitting diodes, another advantageous embodiment of the invention proposes that the bonding layer sequence have at least one gold layer, one aluminum layer, one insulating layer, one adhesion-promoting layer, one blocking layer and/or one contact layer. Insulating layers make it possible, for example, to prevent an electrical short-circuit between the anode and the cathode of the organic light-emitting diode.

If a layer sequence of gold layers, aluminum layers and blocking layers is used, the ductility of the aluminum in conjunction with the inert properties of gold can be used for producing a solid bond with the aid of thermocompression, without causing so-called purple plague due to the contact between gold and aluminum. Adhesion-promoting layers can bring about uniform wetting within the layer sequences.

Contact layers make it possible to contact the OLEDs encapsulated within the cover layers and the bonding layer sequences.

With respect to the encapsulation of OLEDs, another advantageous embodiment of the method proposes that several organic light-emitting diode structures be encapsulated between two cover layers, and that the encapsulated OLED structures be subsequently separated. This embodiment of the method allows an inexpensive and efficient manufacture of a multitude of organic light-emitting diodes.

An organic light-emitting diode (OLED) manufactured in accordance with the inventive method features an improved hermetic encapsulation due to the thermocompression method used, and can be cost-efficiently manufactured. Such an organic light-emitting diode generally has a longer service life due to the improved hermetic encapsulation achieved by means of a metallic bond. In addition, the organic light-emitting diode structures are only briefly subjected to elevated temperatures during the joining step.

DETAILED DESCRIPTION OF THE DRAWINGS

The figures show schematic representations that are by no means true-to-scale.

Figure 1:
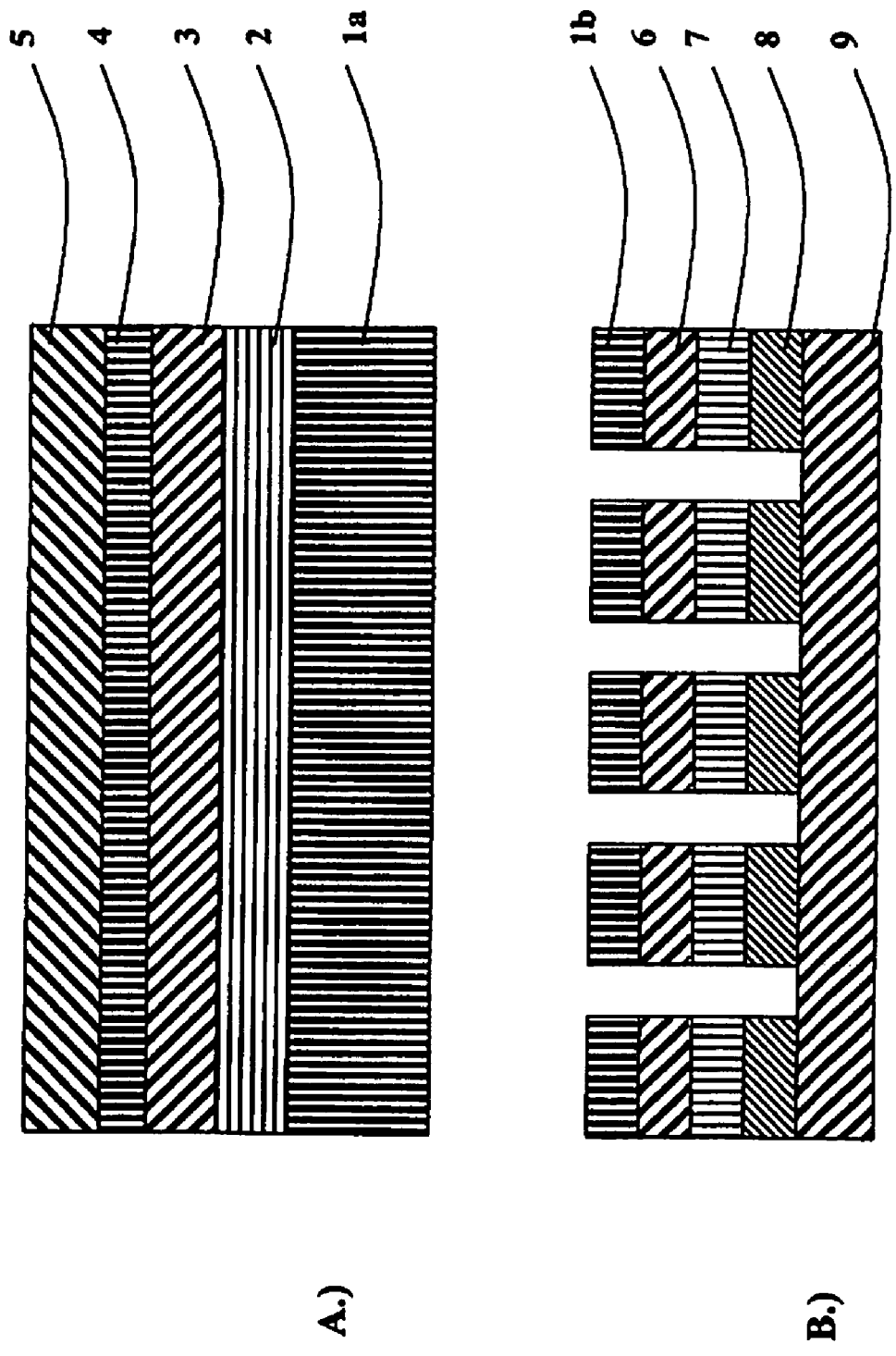
FIGS. 1A and 1B show one possible layer structure suitable for use in the inventive method for the manufacture of several thin-film semiconductor devices.

FIG. 1A shows one advantageous embodiment of a layer sequence on an equivalent substrate for use in the inventive method. In this case, a contacting layer in the form of a gold layer 4 is initially applied onto a carrier or equivalent substrate 5, for example, a germanium carrier, a ceramic carrier, a metal sheet or a semiconductor wafer. According to the invention, all electrically conductive materials are suitable as contact layers for use in this method.

A blocking layer 3 is arranged on the contact layer 4. Blocking layers of this type may contain alloys of titanium and tungsten (TiW) or alloys of titanium tungsten and nitrogen (TiW:N). In addition, it would also be conceivable to utilize blocking layers of nickel or blocking layers of nickel in combination with titanium tungsten nitrogen alloys. The nitriding of the titanium and tungsten atoms is usually not complete within the TiW:N alloys. The cited alloys may contain different concentrations of the individual alloying elements. The concentration of the alloying elements depends on the parameters of the inventive method in this case. The thickness of these blocking layers is also dependent on the process parameters, for example, on the process temperature and the effective duration as well as the pressure of the thermocompression process.

An adhesion-promoting layer 2 is arranged on the blocking layer 3. An adhesion-promoting layer of this type may contain titanium, a layer sequence of titanium and platinum or even chrome layers. A bonding layer 1a is arranged on this adhesion-promoting layer. A gold layer is generally used as the bonding layer in the inventive method. The gold layer 1a may have a thickness of 2000 nm. However, a layer sequence consisting of several layers may be used instead of a simple gold layer in other embodiments.

In FIG. 1B, several identical semiconductor light-emitting diode structures are arranged adjacent to one another on an growth substrate 9, wherein only one of these structures is provided with reference symbols. The growth substrate 9 may consist of any semiconductor wafer, particularly a gallium arsenide wafer. When producing the LED structures on the epitaxial layer 9, a light-emitting diode structure 8, which is not discussed in greater detail, is initially deposited in accordance with an established method. This structure may consist, for example, of a light-emitting diode structure based on AlGaInP (aluminum gallium indium phosphide) or any other conceivable light-emitting diode structure. The light-emitting diode structure 8 has a semiconductor layer sequence that depends on the respective function. These layer sequences may contain active layers, doped layers, buffer layers and other layers.

Contact layers 7 are arranged on the individual light-emitting diode structures 8. Contact layers according to the invention may consist, for example, of gold-germanium alloys (Au:Ge).

On the other hand, blocking layers 6 are arranged on these contact layers 7. The layer sequences may contain blocking layers 6 of titanium tungsten, titanium tungsten nitride, nickel layers or combinations of these materials. On the other hand, bonding layers 1b are arranged on the blocking layers 6. These bonding layers 1b may consist of gold or another layer sequence of gold layers, blocking layers and other layers, preferably ductile metal layers. The thickness of a bonding layer of gold amounts to approximately 100 nm in the described embodiment.

In the inventive method, the layer sequences shown in FIGS. 1A and 1B are mutually contacted with the sides featuring the bonding layers 1a, 1b and then joined to one another with the aid of thermocompression. After this joining step is completed, the growth substrate 9 can be removed, and the individual light-emitting diode structures can be separated, for example, by means of sawing. The resulting devices fall under the scope of the invention.

During the joining with the aid of thermocompression, the two layer sequences are pressed against one another with high pressure. When processing wafers that have a diameter of 100 mm and approximately 50% of which are covered with light-emitting diode structures, it is necessary to exert a force of at least 1000 N during the joining step. Stable processes are achieved with forces between 5000 and 100,000 N.

The arrangement is heated to a temperature between 200 and 500° C. while the two layer structures are pressed together. When processing light-emitting diode structures based on gallium indium nitride, the advantageous temperature range lies between 350° C. and 400° C., with a temperature range between 350° C. and 500° C. being advantageous for light-emitting diode structures based on aluminum gallium indium phosphite. When using a germanium carrier 5 with adjacent gold layer 4 as shown in FIG. 1A, the process temperature should be limited to 360° C.

The process temperature used should be applied to the components to be bonded for at least 10 sec, preferably for more than 1 min. According to particularly preferred embodiments of the method, the process temperature is applied to the components to be bonded for between 2 and 10 min. The upper limits of the application time of the process temperature are defined by requirements with respect to the throughput (productivity) and requirements with respect to the semiconductor layer structures. Excessively long application times can affect or even destroy the layer structures.

Figure 2:
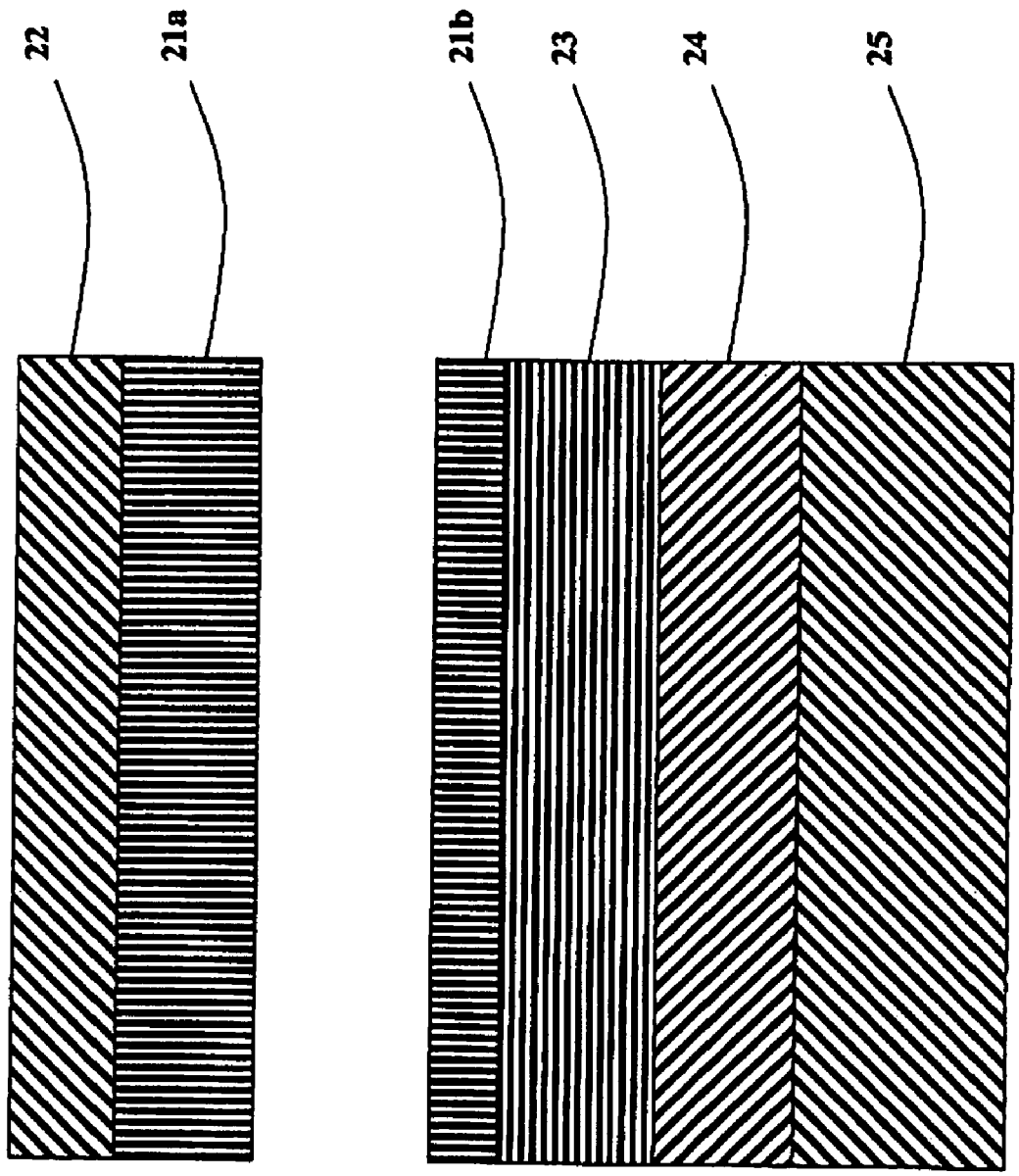
FIGS. 2A and 2B show another layer structure for the manufacture of inventive thin-film semiconductor devices.

FIGS. 2A and 2B show another advantageous embodiment of a layer sequence for the inventive method. In FIG. 2A, a bonding layer 21a is arranged on the equivalent substrate 22 in the direction of the subsequent joining zone. The equivalent substrates may consist of semiconductor wafers, metal sheets or ceramic carriers. It is particularly preferred that the equivalent substrate 22 consists of a molybdenum sheet. The bonding layer 21a generally consists of a gold layer, but may also feature a combination of at least one gold layer with additional blocking layers and additional metallic layers.

FIG. 2B shows one embodiment of a layer sequence for an inventive method for manufacturing thin-film semiconductor devices or semifinished thin-film wafers, respectively. At least one semiconductor structure 24, which is not discussed in greater detail, is arranged on a growth substrate 25 that consists, for example, of a semiconductor material, particularly a semiconductor wafer such as, for example, a gallium arsenide wafer or a sapphire wafer. The semiconductor structure 24 may be realized in the form of a light-emitting diode structure or the structure of any other semiconductor device. It may consist, for example, of a light-emitting diode structure based on gallium indium nitride (GaInN).

An adhesion-promoting layer 23 of silver (Ag) is arranged on this semiconductor layer structure that may feature doping layers, active layers, contact layers and/or reflective layers. On the other hand, a bonding layer 21b is arranged on this adhesion-promoting layer 23. In the inventive method, it is generally preferred to realize the bonding layers 21b of gold (Au), although the bonding layers themselves may also consist of a layer structure. For example, these layer structures may be composed of several metal layers and/or at least one blocking layer.

In the inventive method, the layer sequences shown in FIGS. 2A and 2B are joined with the aid of thermocompression. In this case, high pressure is exerted while a process temperature acts on the layer structures for the duration of the process. This causes a joining zone to form during the thermocompression step without creating any molten metals. Within this joining zone, a recrystallization of the individual metal crystallites takes place beyond the original joint boundary such that a clear joint boundary can no longer be detected after the thermocompression. A bond that is adequately thermal as well as electrically conductive is ensured in this fashion. The two layer sequences are also solidly joined to one another.

Figure 3:
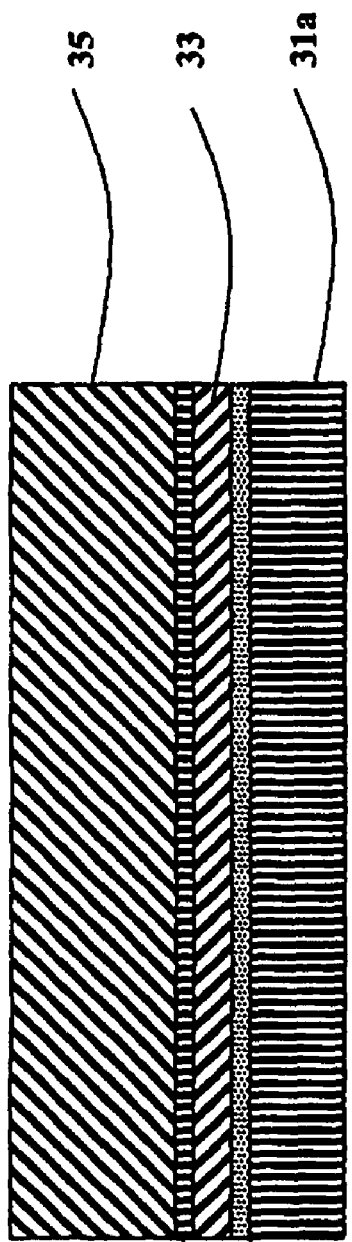
FIGS. 3A and 3B show a third layer structure for the manufacture of inventive semiconductor devices.
Figure 3:
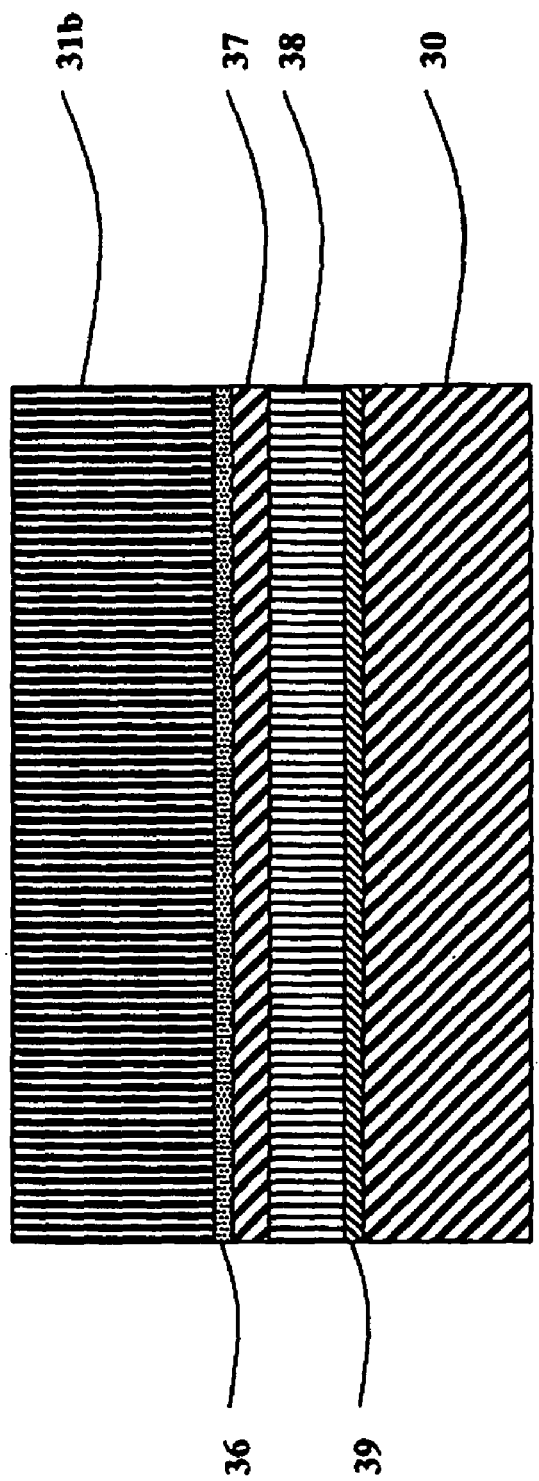

FIGS. 3A and B show embodiments of layer sequences for use in the inventive joining method realized by means of thermocompression. In Part 3A), an intermediate layer 34 that may contain, for example, aluminum is arranged on an equivalent substrate 35 that may consist, for example, of a wafer of a semiconductor material, particularly a germanium wafer or a ceramic carrier or a metal sheet.

A blocking layer 33 is arranged on this intermediate layer 34 and may consist, for example, of a titanium tungsten alloy. An adhesion-promoting layer 32 that may contain, for example, platinum is arranged above this blocking layer 33. A bonding layer 31a, of gold, for example, is arranged on the adhesion-promoting layer 32.

In the layer sequence shown in FIG. 3B, a reflective layer 39 containing a silicone nitrogen compound, for example, $SiN_x$, is arranged on the growth substrate 30, for example, of gallium arsenide (GaAs). A contact layer 38 that may also have a reflective function is arranged on this reflective layer. This contact layer 38 may consist, for example, of a gold-zinc alloy (Au:Zn) with a thickness between 100 nm and 3 μm. Alternatively, the contact layer may contain an alloy of gold and germanium (Au:Ge). This contact layer 38 may also consist of a combination of both alloys and/or have an additional reflective function.

A blocking layer 37 is arranged on this contact layer 38. This blocking layer may consist, for example, of a titanium tungsten alloy or a titanium tungsten nitrogen alloy. An adhesion-promoting layer 36 is arranged on this blocking layer 37. The adhesion-promoting layer 36 may consist, for example, of titanium or of platinum or a sequence of titanium and platinum layers. A bonding layer 31b that preferably consists of gold is arranged on this adhesion-promoting layer 36.

The bonding layers 31b and 31a may consist, for example, of gold or a sequence of layers of different materials and blocking layers. The metal layers are deposited, for example, by means of PVD or CVD in this case, but may also contain intermediate layers of metal powder within the layer sequence. In addition to the growth substrate 30 of gallium arsenide, the layer may also contain a semiconductor layer sequence, wherein the semiconductor layer sequence itself may in turn contain functional layers such as active layers, doped layers, contact layers, reflective layers and buffer layers.

The transfer of a functional semiconductor layer sequence based on gallium arsenide compounds onto an equivalent substrate of germanium is particularly advantageous in this case because the thermal expansion of germanium is very well adapted to the thermal expansion of gallium arsenide, such that few internal tensions are created under thermal stress. In the inventive method, the bonding layers 31a and 31b are joined to one another with the aid of thermocompression.

In one preferred embodiment of the inventive method, the layer sequences shown in FIGS. 1A and 1B are pressed against one another with a force of 6.5 kN for 3 min at a process temperature of 340° C. The layer sequence on the side of the equivalent substrate features a gold layer with a thickness of 1000 nm, and the layer sequence on the side of the growth substrate features a gold layer with a layer thickness of 1200 nm. These two gold layers or bonding layers 31a and 31b were joined in initial tests by utilizing the aforementioned process parameters. A homogenous bond was produced over the entire surface of the wafer that had a diameter of 100 mm. A visible joint boundary surface, in particular, could not be detected during ultrasonic examinations and other inspections. The crystallization of the metal layer was evenly recrystallized over the boundary surface such that no cavities, shrinkage holes or pores (so-called "Dalmatian spots") were created in the joint area.

Figure 4:
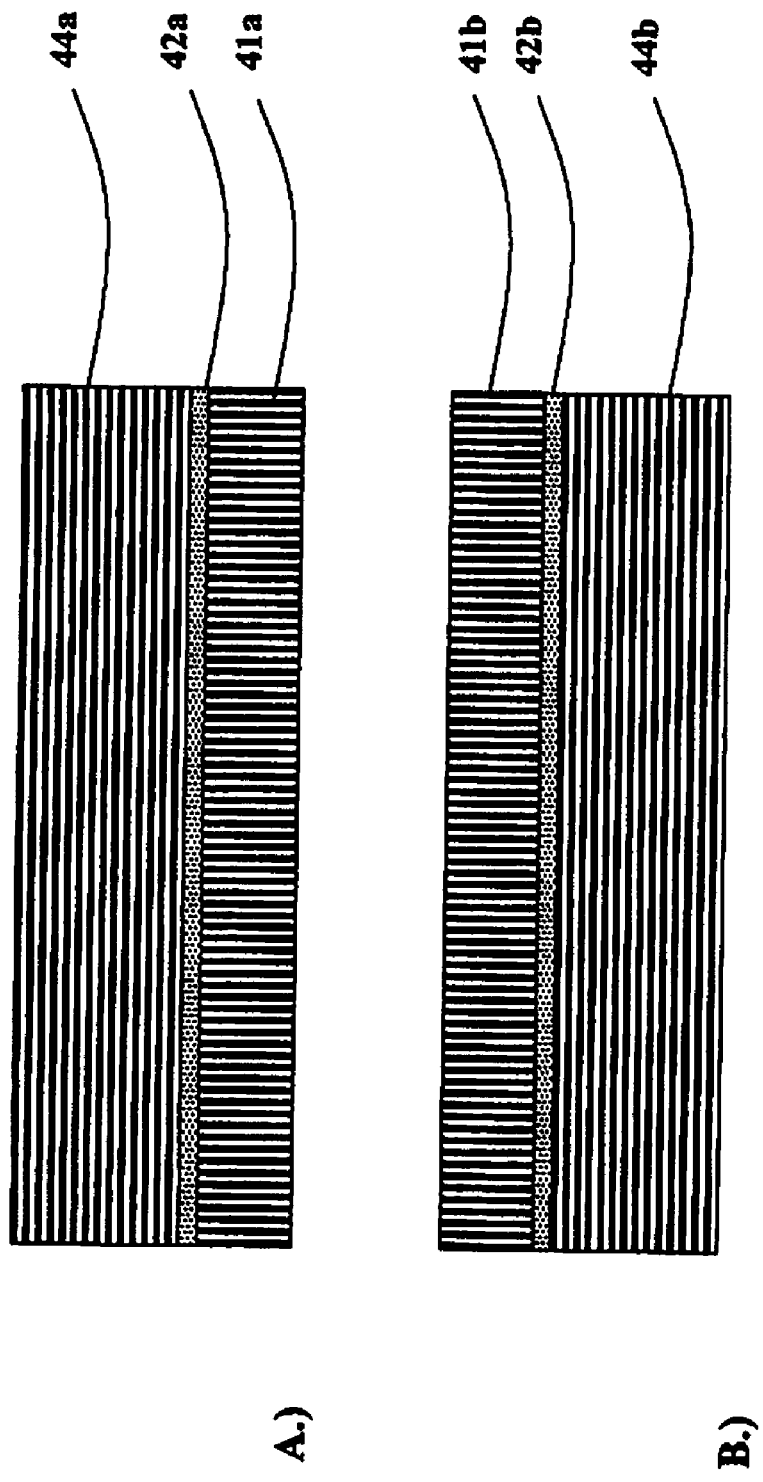
FIGS. 4A and 4B show an embodiment of a different layer structure of the bonding layers for use in the inventive method.

FIGS. 4A and 4B of FIG. 4 respectively show a layer sequence for bonding layers used in the inventive method, as well as corresponding devices. In this case, blocking layers 42a, 42b of a titanium tungsten alloy and/or a titanium tungsten nitrogen alloy and/or of nickel are respectively applied onto aluminum layers 44a, 44b. Gold layers 41a, 41b are respectively applied onto these blocking layers 42a, 42b. In the inventive method, these bonding layers are joined to one another with the aid of thermocompression.

In this case, one utilizes in particular the ductility or deformability of aluminum in combination with the inert properties of gold. However, the possible embodiments of such bonding layers are not restricted to aluminum and gold only. On the contrary, it is also possible to use any metal with similar ductility properties or any precious metal with similar inert properties.

Such a structure of bonding layers in particular makes it possible to carry out the thermocompression without ultrasonic welding processes or friction processes. If these bonding layers or layer sequences are joined to one another with the inventive method, a metallic bond between the innermost layers, for example, the gold layers 41a, 41b, is produced without creating any liquid molten metal. The bonding layers are pressed against one another with high pressure at a process temperature up to 500° C. such that a recrystallization of the metal crystallites of the gold or the inert material of the innermost layers occurs. A solid and permanent bond is produced.

Figure 5:
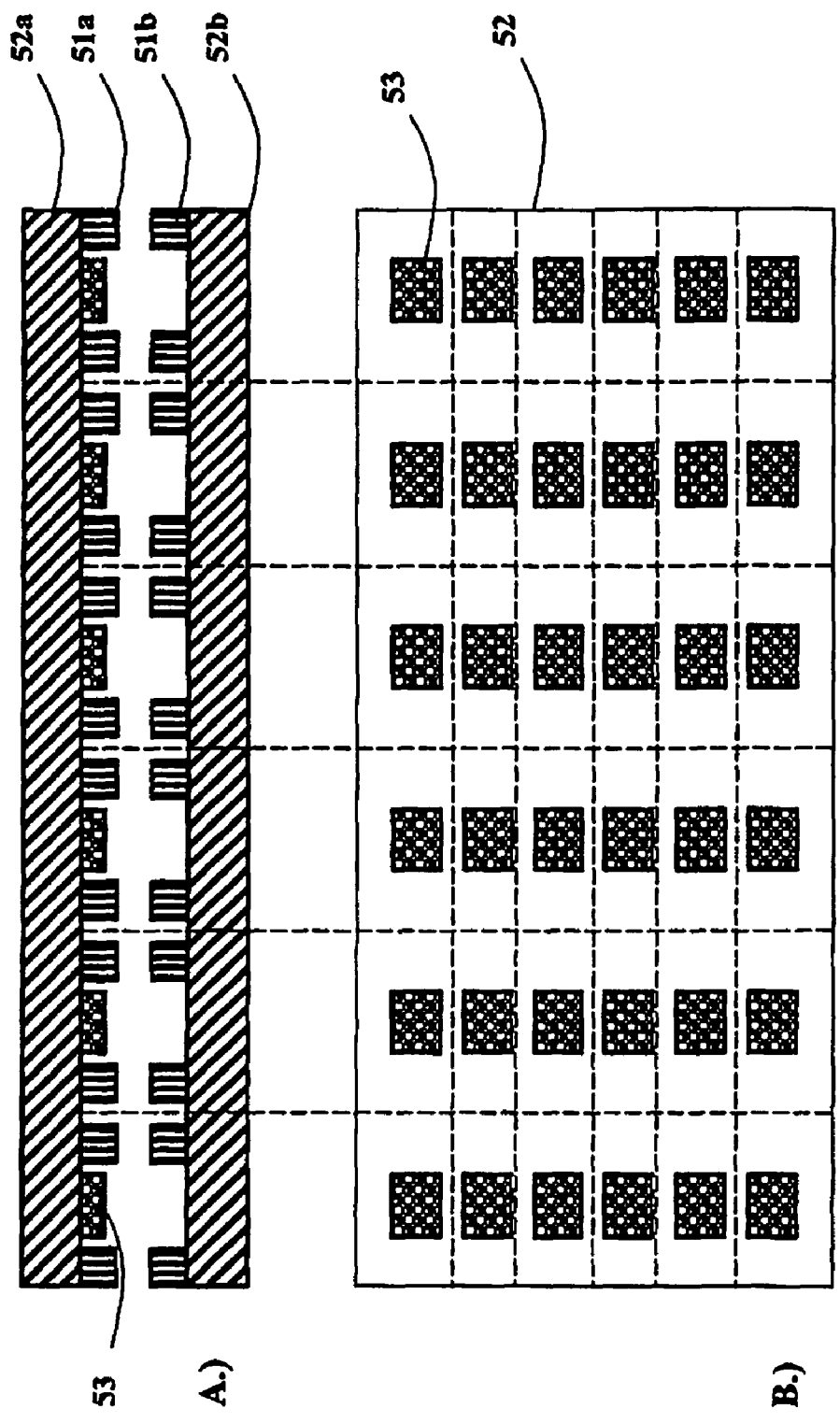
FIGS. 5A and 5B show a schematic representation of the method for manufacturing a multitude of encapsulated organic light-emitting diodes.

FIGS. 5A and 5B show the structure of layers for an inventive method for the manufacture or encapsulation of organic light-emitting diodes (OLEDs). FIG. 5A shows a schematic cross section through an arrangement prior to the thermocompression. FIG. 5A shows, in particular, two cover layers 52a, 52b that are permanently bonded to one another by means of the thermocompression process such that the organic light-emitting diode structures 53 are permanently encapsulated.

These cover layers 52a, 52b preferably consist at least partially of transparent material. This material may contain, for example, glass or various polymers. In addition, these layers may feature other functional layers on the side facing the joining zone. These layers may consist, for example, of contact layers for the anode or cathode of the organic light-emitting diode structure 53. Each organic light-emitting diode structure 53 is respectively bordered by two bonding layer structures 51a that are respectively situated opposite from a component to be bonded in the form of bonding layer structures 51b on the opposite layer.

The bonding layer structures 51a, 51b may consist of gold or a combination of layers of ductile and inert metals, as well as blocking layers. It is particularly advantageous that these bonding layers consist of gold or of a layer structure as is illustrated, for example, in FIGS. 4A and 4B. The bonding layers may also contain other functional layers. These include adhesion-promoting layers or insulating layers that electrically insulate the two cover layers to be bonded from one another. In addition, the cover layers 52a, 52b may contain specially designed light out-coupling or light in-coupling surfaces. In the inventive method, the bonding layer structures 51a, 51b are bonded to one another with the aid of thermocompression. The aforementioned process parameters may also be used in this case.

FIG. 5B shows a top view of such an arrangement. In this case, several organic light-emitting diode structures 53 are arranged in a rectangular grid between two transparent sheets 52. These sheets have dimensions of 0.4*0.5 m² in preferred embodiments. Once these cover layers or sheets 52 are bonded to one another by means of the thermocompression process and the individual organic light-emitting diode structures 53 are encapsulated, the light-emitting diode structures can be separated. These separated OLEDs have dimensions of approximately 3 * 5 cm² in preferred embodiments.

The light-emitting diode structures are respectively separated along the broken lines shown in FIG. 5A. These lines mark the so-called "scoring frames." The extension of the broken lines toward FIG. 5A shows the progression of the separating lines or scoring frames between the bonding layer structures 51a and 51b.

With respect to the inventive bonding method for encapsulated organic light-emitting diodes, all process parameters and characteristics mentioned in the description can be advantageously utilized. Analogously, the bonding layers 51, 51b may contain layer sequences of all layer types mentioned in the description of this invention.

The invention is not limited by the description of the embodiments. On the contrary, the invention includes any new feature as well as any combination of features, particularly any combination of features in the claims, even if this feature or this combination itself is not explicitly mentioned in the claims or the embodiments.

The invention claimed is:

1. A method for manufacturing organic light-emitting diodes, wherein at least one element of the group consisting of anode, cathode, radiation-emitting polymers, electron hole-conducting polymers, radiation-emitting small molecules and electron hole-conducting small molecules is encapsulated between two cover layers with the aid of thermocompression wherein several organic light-emitting diode structures are arranged between the two cover layers and separated after the encapsulation.

2. The method according to claim 1, wherein at least one of the two cover layers comprises a transparent material.

3. The method according to claim 1, wherein another material or a layer sequence of materials is applied onto sections of both cover layers, and wherein these are bonded to another with the aid of thermocompression.

4. The method according to claim 3, wherein the layer sequence comprises at least one element of the group consisting of gold layer, aluminum layer, insulating layer, adhesion-promoting layer, blocking layer and contact layer.

5. An organic light-emitting diode (OLED) being manufactured in accordance with the method of claim 1.

6. A method for producing a semiconductor device by bonding a plurality of layer sequences, wherein each of the layer sequences comprises a thermally bondable layer consisting of gold, and at least one of the layer sequences comprises a semiconductor material,
   wherein the method comprises applying thermocompression to the plurality of layer sequences for producing a joint layer formed by said gold layers;
   wherein each of the layer sequences further comprises a blocking layer comprised of a material selected from the group consisting of 1) TiW alloy; 2) TiW:N alloy; 3) nickel; 4) nickel in combination with a TiW alloy; and 5) nickel in combination with a T1W:N alloy;
   wherein each of the layer sequences further comprises an intermediate layer comprising aluminum as a ductile layer; and
   wherein in each of the layer sequences, in a direction away from the joint layer, the blocking layer is located between the joint layer and the intermediate layer.

7. The method according to claim 6, wherein the semiconductor material contains an epitaxially structured layer sequence that predominantly comprises III-V-semiconductor materials.

8. The method according to claim 6, wherein the semiconductor material comprises a thin-film chip, particularly a thin-film light-emitting diode.

9. The method according to claim 6, wherein one of the layers comprises an equivalent substrate, the equivalent substrate and the semiconductor material respectively feature a gold layer the semiconductor material has a growth substrate, which is different from the equivalent substrate.

10. The method according to claim 9, wherein the gold layers have different thicknesses.

11. The method according to claim 9, wherein at least one functional layer is respectively arranged between the first gold layer and the semiconductor material and between the second gold layer and the equivalent substrate, wherein said functional layer is selected from the group consisting of adhesion-promoting layers, reflective layers, contact layers, buffer layers, and combinations thereof.

12. The method according to claim 6, wherein the thermo-compression process comprises steps that are free of frictional movements or ultrasonic welding processes.

13. A device that comprises a semiconductor material and a joining layer and is manufactured in accordance with the method of claim 6.

14. The device according to claim 13, comprising sections of at least one component to be bonded include pads for realizing electrical contact.

15. A semi-finished product, in particular a wafer, comprising a semiconductor material and a joining layer and being bonded in accordance with the method of claim 6.

16. The method of claim 6 wherein the bonding of the layer sequences is conducted at a temperature between 200° C. and 500° C., inclusive, and at a pressure between 0.1 MPa and 20 MPa, inclusive.

17. The method of claim 6 wherein in each of the layer sequences, where the blocking layer is directly sandwiched between the aluminum ductile layer and the gold layer.

* * * * *